United States Patent
Oba

(10) Patent No.: US 7,892,898 B2
(45) Date of Patent: Feb. 22, 2011

(54) METHOD FOR MANUFACTURING SEMICONDUCTOR APPARATUS AND METHOD FOR MANUFACTURING ELECTRO-OPTICAL APPARATUS

(75) Inventor: Kazuyuki Oba, Chitose (JP)

(73) Assignee: Seiko Epson Corporation, Tokyo (JP)

(*) Notice: Subject to any disclaimer, the term of this patent is extended or adjusted under 35 U.S.C. 154(b) by 135 days.

(21) Appl. No.: 12/394,675

(22) Filed: Feb. 27, 2009

(65) Prior Publication Data

US 2009/0221132 A1   Sep. 3, 2009

(30) Foreign Application Priority Data

Feb. 28, 2008  (JP)  .............. 2008-047308

(51) Int. Cl.
*H01L 21/00* (2006.01)
(52) U.S. Cl. .............. 438/149; 257/192; 257/195; 438/689
(58) Field of Classification Search ............ 438/149, 438/689; 257/192, 195
See application file for complete search history.

(56) References Cited

U.S. PATENT DOCUMENTS

| 5,942,787 | A * | 8/1999 | Gardner et al. ........... 257/408 |
| 7,501,674 | B2 * | 3/2009 | Lee et al. ............... 257/288 |
| 7,763,531 | B2 * | 7/2010 | Abadeer et al. .......... 438/532 |
| 7,772,048 | B2 * | 8/2010 | Jones et al. ............. 438/142 |
| 2005/0054168 | A1 * | 3/2005 | Currie et al. ........... 438/300 |
| 2005/0077553 | A1 * | 4/2005 | Kim et al. .............. 257/288 |
| 2007/0065990 | A1 * | 3/2007 | Degroote et al. ......... 438/142 |

FOREIGN PATENT DOCUMENTS

| JP | 05-198817 | 8/1993 |
| JP | 06-061260 | 3/1994 |
| JP | 2001-298194 | 10/2001 |
| JP | 2007-242704 | 9/2007 |

\* cited by examiner

*Primary Examiner*—Jarrett J Stark
*Assistant Examiner*—Nicholas Tobergte
(74) *Attorney, Agent, or Firm*—Workman Nydegger

(57) ABSTRACT

A method for manufacturing a semiconductor apparatus includes forming a step layer in a first region on a substrate; forming a first semiconductor thin film on the top surface and sidewalls of the step layer; removing part of the first semiconductor thin film from the top surface while leaving part of the first semiconductor thin film on the sidewalls; removing the step layer; and forming a fin-type transistor that includes the first semiconductor thin film disposed on the sidewalls as a channel.

4 Claims, 5 Drawing Sheets

METHOD FOR MANUFACTURING SEMICONDUCTOR APPARATUS AND METHOD FOR MANUFACTURING ELECTRO-OPTICAL APPARATUS

BACKGROUND

1. Technical Field

The present invention relates to a method for manufacturing a semiconductor apparatus that includes a fin-type transistor and a method for manufacturing an electro-optical apparatus.

2. Related Art

It is known that fin-type transistors having a three-dimensional structure can be used to provide semiconductor apparatuses having larger packing densities. Fin-type transistors include a fin-shaped semiconductor layer disposed substantially perpendicularly to a substrate. The fin-shaped semiconductor layer functions as a channel. Both sides or the top and both sides of the fin-shaped semiconductor layer are covered with a gate insulating film and a gate electrode, forming a dual-gate transistor.

A semiconductor apparatus that includes a fin-type transistor is manufactured as follows. In general, a flat semiconductor layer is formed on an insulating layer disposed on a substrate. The semiconductor layer is patterned by selective reactive ion etching (RIE). The patterned semiconductor layer is thermally oxidized to form a gate insulating film. A gate electrode material is deposited on the gate insulating film and is etched to form a gate electrode.

JP-A-2001-298194 is an example of related art.

As described in JP-A-2001-298194, when a fin-type transistor is manufactured by forming a flat semiconductor layer on a substrate, the channel width of the fin-type transistor is limited by the thickness of the flat semiconductor layer. Thus, the semiconductor layer must have a thickness equivalent to the channel width. However, such a semiconductor layer having a thickness equivalent to a channel width is difficult to apply to another device, such as a transistor, formed on the same substrate. This reduces the degree of flexibility in the manufacture of the device.

SUMMARY

An advantage of some aspects of the invention is to provide a method for manufacturing a semiconductor apparatus that includes a fin-type transistor and has a high degree of flexibility in the manufacture of the apparatus and a method for manufacturing an electro-optical apparatus.

According to a first aspect of the invention, a method for manufacturing a semiconductor apparatus includes forming a step layer in a first region on a substrate; forming a first semiconductor thin film on the top surface and sidewalls of the step layer; removing part of the first semiconductor thin film from the top surface while leaving part of the first semiconductor thin film on the sidewalls; removing the step layer; and forming a fin-type transistor that includes the first semiconductor thin film disposed on the sidewalls as a channel. The channel width of the fin-type transistor can be controlled by the thickness of the step layer, independently of the thickness of a flat semiconductor thin film. A semiconductor thin film that forms the channel of the fin-type transistor can be easily used in the formation of another device, such as a transistor, on the same substrate. This increases the degree of flexibility in the manufacture of the device. In addition to the control of the channel width by the thickness of the step layer, the channel thickness can be controlled by the thickness of the semiconductor thin film. Thus, a fin-type transistor having excellent characteristics can be formed by simpler fine processing.

The method for manufacturing a semiconductor apparatus according to the first aspect of the invention may further include, in forming a semiconductor thin film, forming a second semiconductor thin film in a second region that is separated from the first region on the substrate; in removing part of the first semiconductor thin film, removing part of the second semiconductor thin film in one part of the second region while leaving part of the second semiconductor thin film in the other part of the second region; and in forming a fin-type transistor, forming a planar transistor that includes the part of the second semiconductor thin film remaining in the other part of the second region as a channel. Thus, the fin-type transistor and the planar transistor each having different characteristics can be efficiently formed on the same substrate using the same semiconductor thin film.

The method for manufacturing a semiconductor apparatus according to the first aspect of the invention may further include forming an etching stopper layer on the substrate before forming a step layer. This facilitates the removal of the step layer.

According to a second aspect of the invention, a method for manufacturing an electro-optical apparatus that contains an electro-optic material between a pair of substrates and that includes a transistor includes forming a fin-type transistor on at least one of the substrates by a method for manufacturing a semiconductor apparatus according to an aspect of the invention. A semiconductor thin film that forms a channel of the fin-type transistor can be used to form another device on the same substrate. This increases the degree of flexibility in the manufacture of the electro-optical apparatus. In addition, the channel width and the channel thickness of the fin-type transistor can be controlled by the thickness of a step layer and the thickness of a semiconductor thin film. Thus, an electro-optical apparatus that includes a fin-type transistor having excellent characteristics can be manufactured by simpler fine processing.

According to a third aspect of the invention, a method for manufacturing an electro-optical apparatus that contains an electro-optic material between a pair of substrates and that includes a pixel circuit and peripheral circuitry of a display on one of the substrates includes forming a fin-type transistor on one of the pixel circuit and the peripheral circuitry, and forming a planar transistor on the other of the pixel circuit and the peripheral circuitry, on the one of the substrates, by a method for manufacturing a semiconductor apparatus according to an aspect of the invention. Thus, the fin-type transistor and the planar transistor each having different characteristics can be efficiently formed on the same substrate of the electro-optical apparatus using the same semiconductor thin film. The channel width of the fin-type transistor can be controlled by the thickness of a step layer. In addition, the channel thickness of the fin-type transistor can be controlled by the thickness of a semiconductor thin film. Thus, an electro-optical apparatus that includes a fin-type transistor having excellent characteristics can be manufactured by simpler fine processing.

BRIEF DESCRIPTION OF THE DRAWINGS

The invention will be described with reference to the accompanying drawings, wherein like numbers reference like elements.

DESCRIPTION OF EXEMPLARY EMBODIMENTS

Method For Manufacturing Semiconductor Apparatus According to Embodiment

Figure 1A:
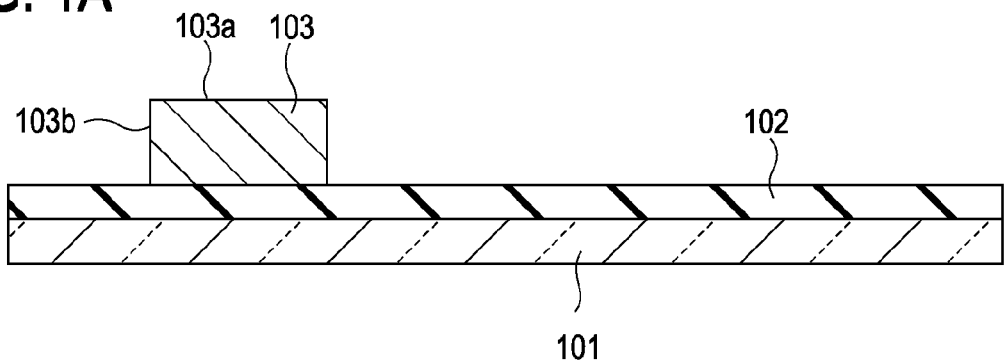
FIGS. 1A to 1D are explanatory cross-sectional views illustrating the first half of the process in a method for manufacturing a semiconductor apparatus according to an embodiment of the invention.
Figure 1B:
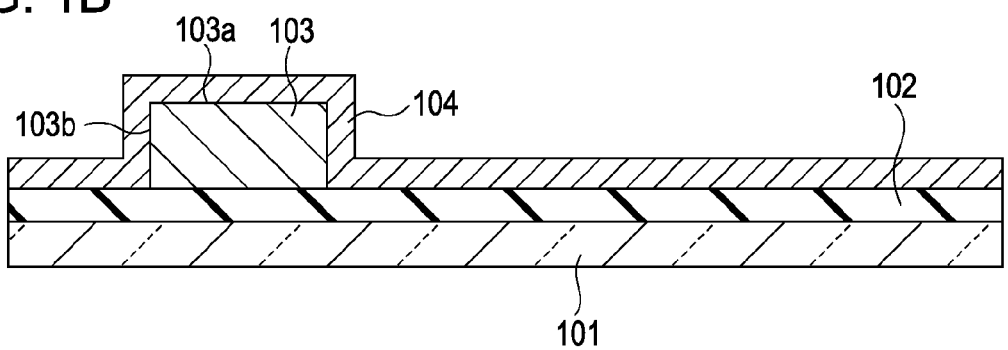
Figure 1C:
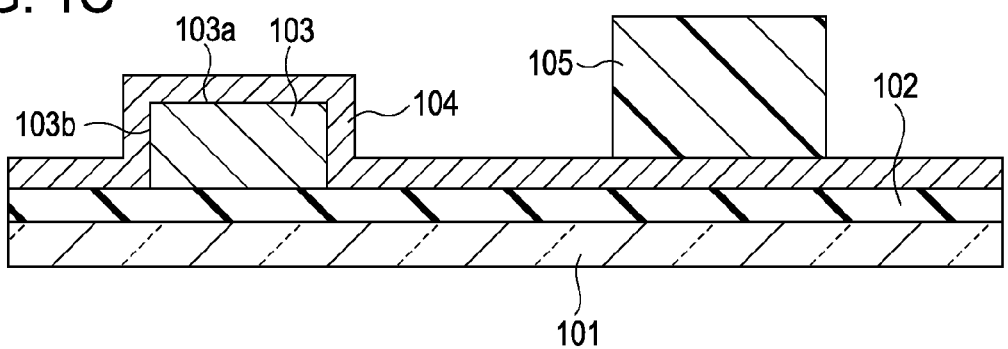
Figure 1D:
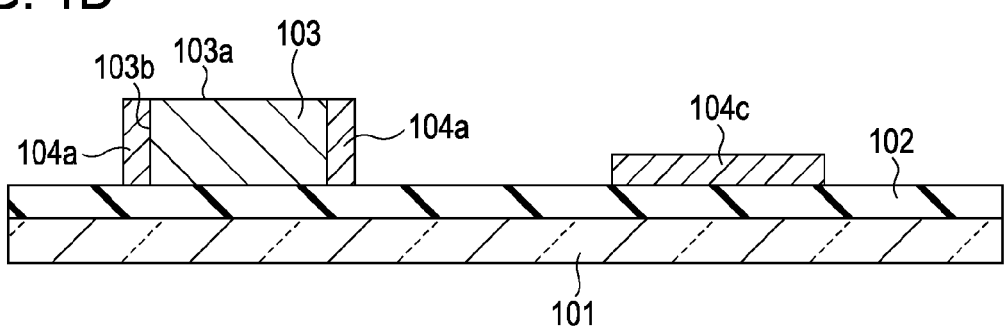
Figure 3A:
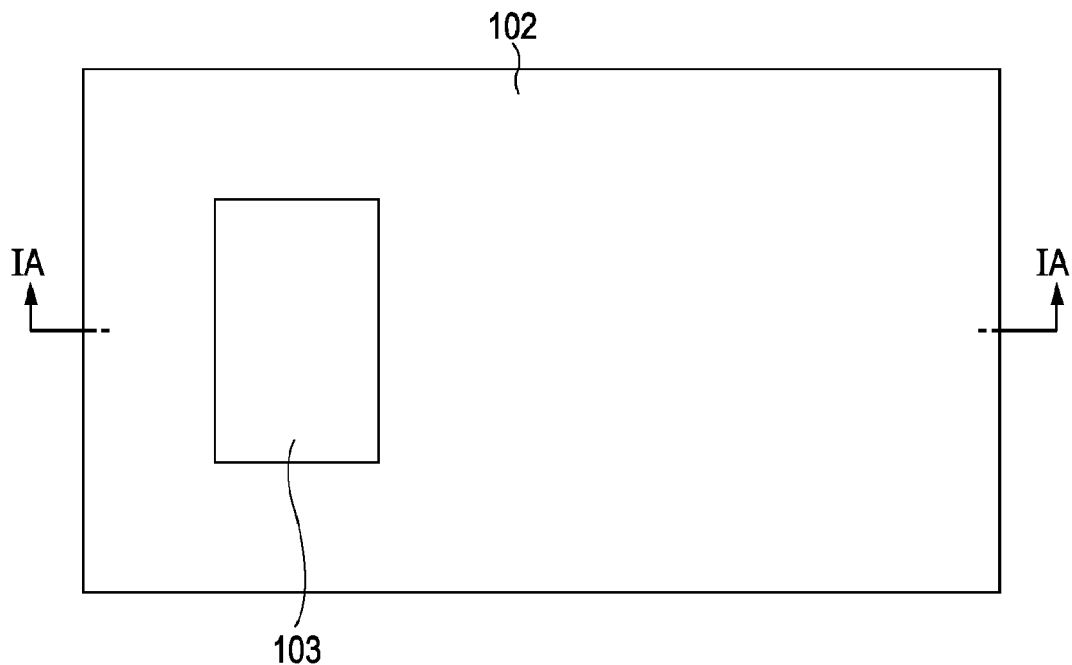
FIG. 3A is an explanatory plan view of FIG. 1A.
Figure 3B:
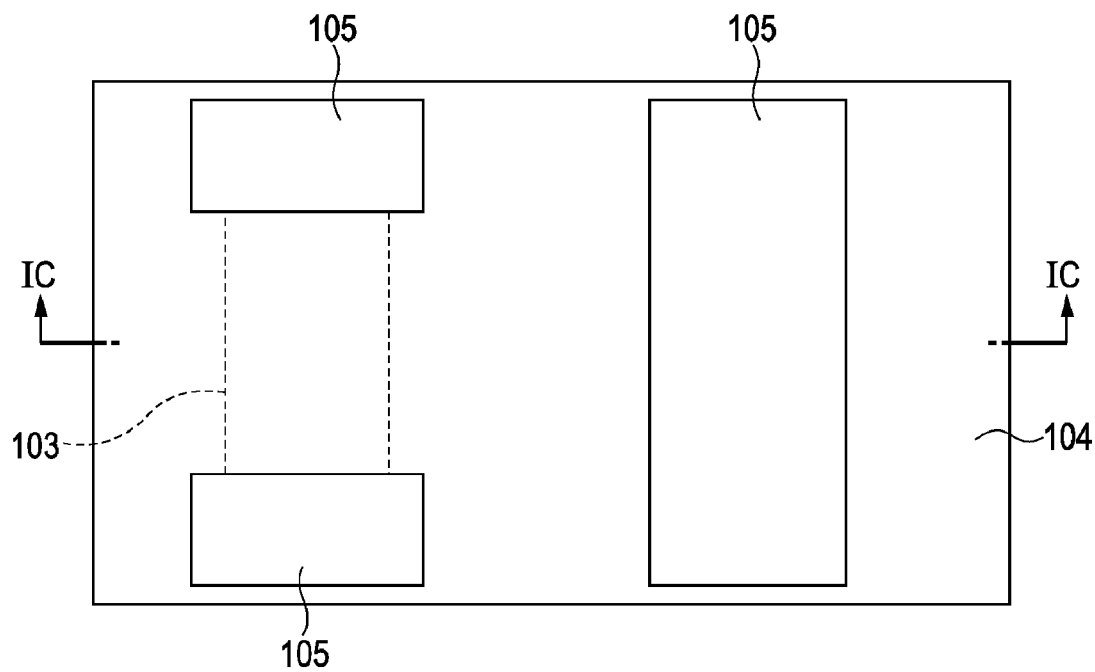
FIG. 3B is an explanatory plan view of FIG. 1C.
Figure 4A:
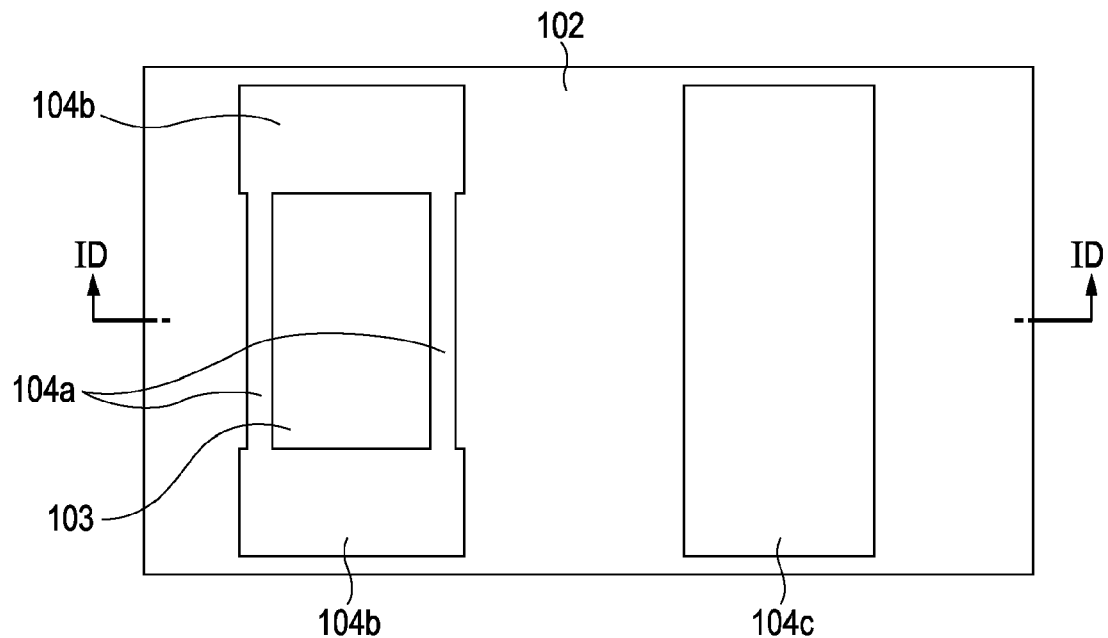
FIG. 4A is an explanatory plan view of FIG. 1D.
Figure 4B:
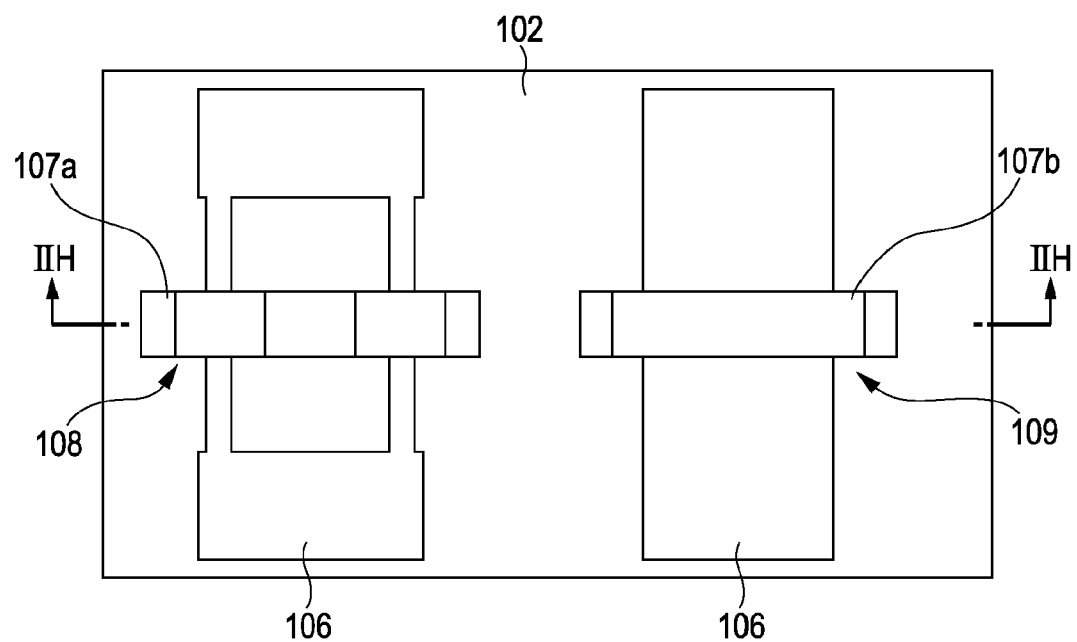
FIG. 4B is an explanatory plan view of FIG. 2D.

A method for manufacturing a semiconductor apparatus according to an embodiment will be described below. FIGS. 1A to 1D are explanatory cross-sectional views illustrating the first half of the process in a method for manufacturing a semiconductor apparatus according to an embodiment of the invention. FIGS. 2A to 2D are explanatory cross-sectional views illustrating the second half of the process. FIGS. 3A and 3B are explanatory plan views of FIGS. 1A and 1C, respectively. FIGS. 4A and 4B are explanatory plan views of FIGS. 1D and 2D, respectively. FIG. 1A is a cross-sectional view taken along line IA-IA in FIG. 3A. FIG. 1C is a cross-sectional view taken along line IC-IC in FIG. 3B. FIG. 1D is a cross-sectional view taken along line ID-ID in FIG. 4A. FIG. 2D is a cross-sectional view taken along line IIH-IIH in FIG. 4B.

A step layer 103 is formed in a first region on a substrate 101. In the present embodiment, an insulating film 102 is formed on the substrate 101, and the step layer 103 is formed on the insulating film 102 in the first region having the shape of a rectangle as viewed from the top (see FIGS. 1A and 3A). The substrate 101 may be a glass substrate, a quartz substrate, or a silicon substrate. The insulating film 102 may be a $SiO_2$, $Si_3N_4$, AlN, or alumina film, another insulating metal oxide film, or an insulating organic material film. For example, the insulating film 102 is a $SiO_2$ film formed by chemical vapor deposition (CVD). The step layer 103 may be formed of any material that can be selectively etched together with the insulating film 102 and a semiconductor thin film 104 described below. The step layer 103 may be formed by photolithography. The step layer 103 may have any thickness that is larger than the thickness of the semiconductor thin film 104. For example, the step layer 103 has a thickness in the range of 0.1 to 2.0 µm.

The insulating film 102 serves as an etching stopper layer and facilitates the removal of the step layer 103 in the removal of the step layer 103 described below. The insulating film 102 may be replaced with another etching stopper layer formed on the substrate 101. Alternatively, before the formation of the step layer 103, an etching stopper layer may be formed on the insulating film 102, and the step layer 103 may be formed on the etching stopper layer. As in the insulating film 102 serving as an etching stopper layer, that other etching stopper layer or the etching stopper layer formed on the insulating film 102 may also be formed of any material that can be selectively etched together with the step layer 103.

The semiconductor thin film 104 is formed on top of the substrate 101 to cover the top surface 103a and the sidewalls 103b of the step layer 103. The semiconductor thin film 104 also covers a second region that is separated from the first region of the step layer 103 (see FIG. 1B). The semiconductor thin film 104 may be formed of any material, including polysilicon and single-crystal silicon. For example, the semiconductor thin film 104 may be a polysilicon film formed by CVD of amorphous silicon followed by laser annealing. The semiconductor thin film 104 may have any thickness that is smaller than the thickness of the step layer 103. For example, the semiconductor thin film 104 has a thickness of 0.05 µm.

As illustrated in FIGS. 1C and 3B, resist patterns 105 are then formed in rectangular regions on the short sides of the step layer 103 and a rectangular region parallel to the longitudinal direction of the step layer 103 by photolithography. Part of the semiconductor thin film 104 not covered with the resist patterns 105 is selectively removed by RIE. The resist patterns 105 are then removed. The etching depth is equal to the thickness of the semiconductor thin film 104. Thus, as illustrated in FIGS. 1D and 4A, in the first region of the step layer 103, part of the semiconductor thin film 104 covering the top surface 103a of the step layer 103 is removed, and thereby semiconductor thin films 104a are left on the sidewalls 103b of the step layer 103. Semiconductor thin films 104b are also left in the rectangular regions on the short sides of the step layer 103. The semiconductor thin films 104a according to the present embodiment are disposed substantially vertically and have an elongated shape as viewed from the top. The semiconductor thin films 104b are substantially rectangular parallelepipeds. The step layer 103 are in contact with the semiconductor thin films 104a and the semiconductor thin films 104b and are surrounded by the semiconductor thin films 104a and the semiconductor thin films 104b. Furthermore, in the second region separated from the first region of the step layer 103, a semiconductor thin film 104c is left in the rectangular region, which is part of the second region, parallel to the longitudinal direction of the step layer 103. The semiconductor thin film 104c is substantially rectangular.

Figure 2A:
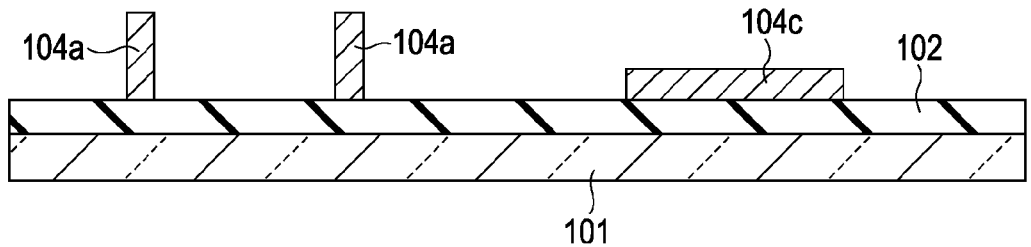
FIGS. 2A to 2D are explanatory cross-sectional views illustrating the second half of the process in a method for manufacturing a semiconductor apparatus according to an embodiment of the invention.
Figure 2B:
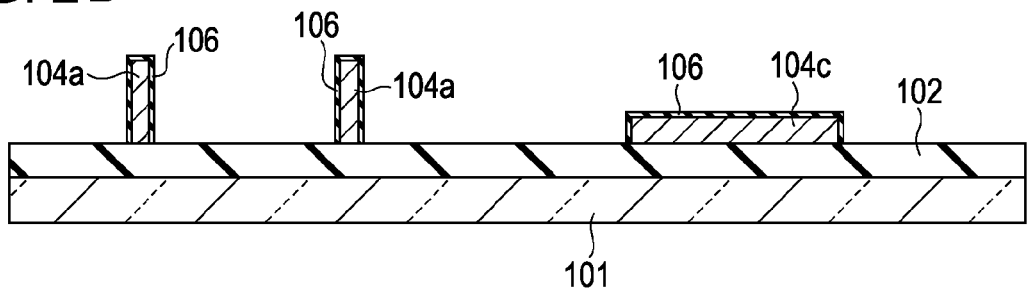

As illustrated in FIG. 2A, the step layer 103 is then removed from the substrate 101, for example, by RIE. As illustrated in FIG. 2B, gate insulating films 106 are then formed on the semiconductor thin films 104a, 104b, and 104c, for example, by thermal oxidation.

Figure 2C:
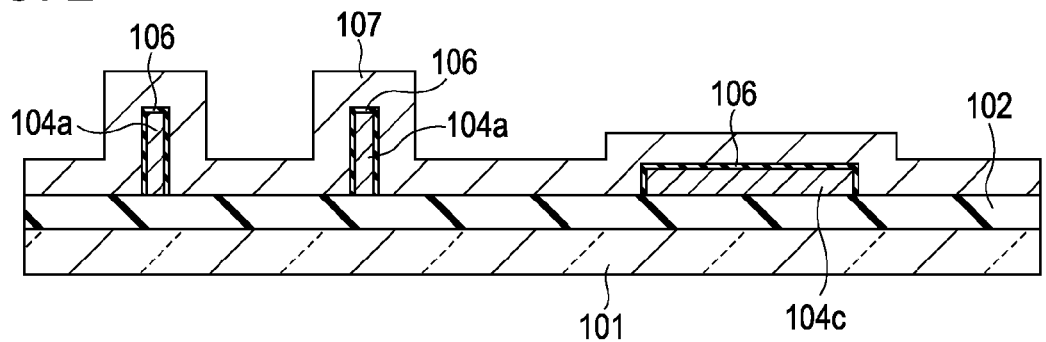
Figure 2D:
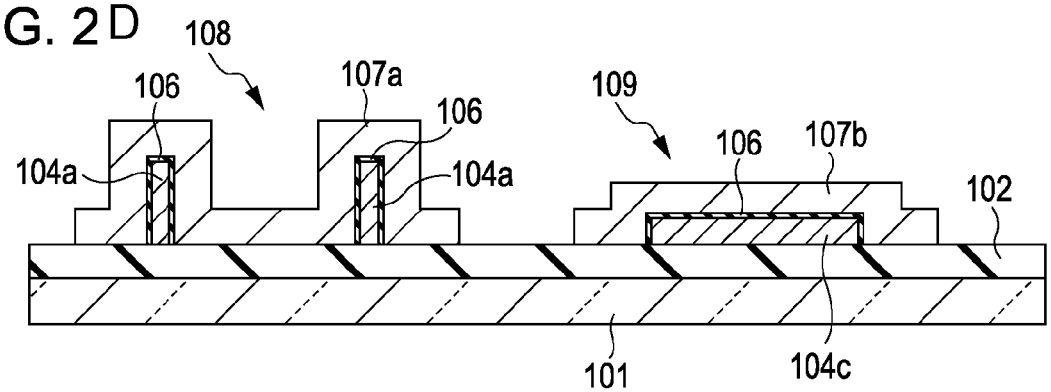

As illustrated in FIG. 2C, a gate electrode film 107 is formed on top of the substrate 101 to cover the semiconductor thin films 104a, 104b, and 104c, for example, by CVD. The gate electrode film 107 may be formed of any electroconductive material that has a desired work function and electric conductivity. Examples of such a material include semiconductors, such as $n^+$- and $p^+$-polysilicon, $n^+$- and $p^+$-type polycrystalline SiGe mixed crystals, $n^+$- and $p^+$-type polycrystalline Ge, and $n^+$- and $p^+$-type polycrystalline SiC, metals, such as Mo, W, and Ta, metal nitrides, such as TiN and WN, and silicides, such as platinum silicide and erbium silicide.

As illustrated in FIGS. 2D and 4B, the gate electrode film 107 is patterned by photolithography and RIE to form a gate electrode 107a in the center of the semiconductor thin films 104a and a gate electrode 107b in the center of the semiconductor thin film 104c across each longitudinal axis. The resulting fin-type transistor 108 includes the semiconductor thin films 104a as channels, and the resulting planar transistor 109 includes the semiconductor thin film 104c as a channel.

A method for manufacturing a semiconductor apparatus according to the present embodiment can efficiently form the fin-type transistor 108 and the planar transistor 109 each having different characteristics on the single substrate 101 using the single semiconductor thin film 104. Thus, the method has a high degree of flexibility. Furthermore, the channel width of the fin-type transistor 108 can be controlled by the thickness of the step layer 103, and the channel thickness of the fin-type transistor 108 can be controlled by the thickness of the semiconductor thin film 104. Thus, the fin-type transistor 108 having excellent characteristics can be formed with a reduced load of fine processing, such as etching. The insulating film 102 serving as an etching stopper layer can facilitate the removal of the step layer 103 formed thereon.

Electro-Optical Apparatus

Figure 5:
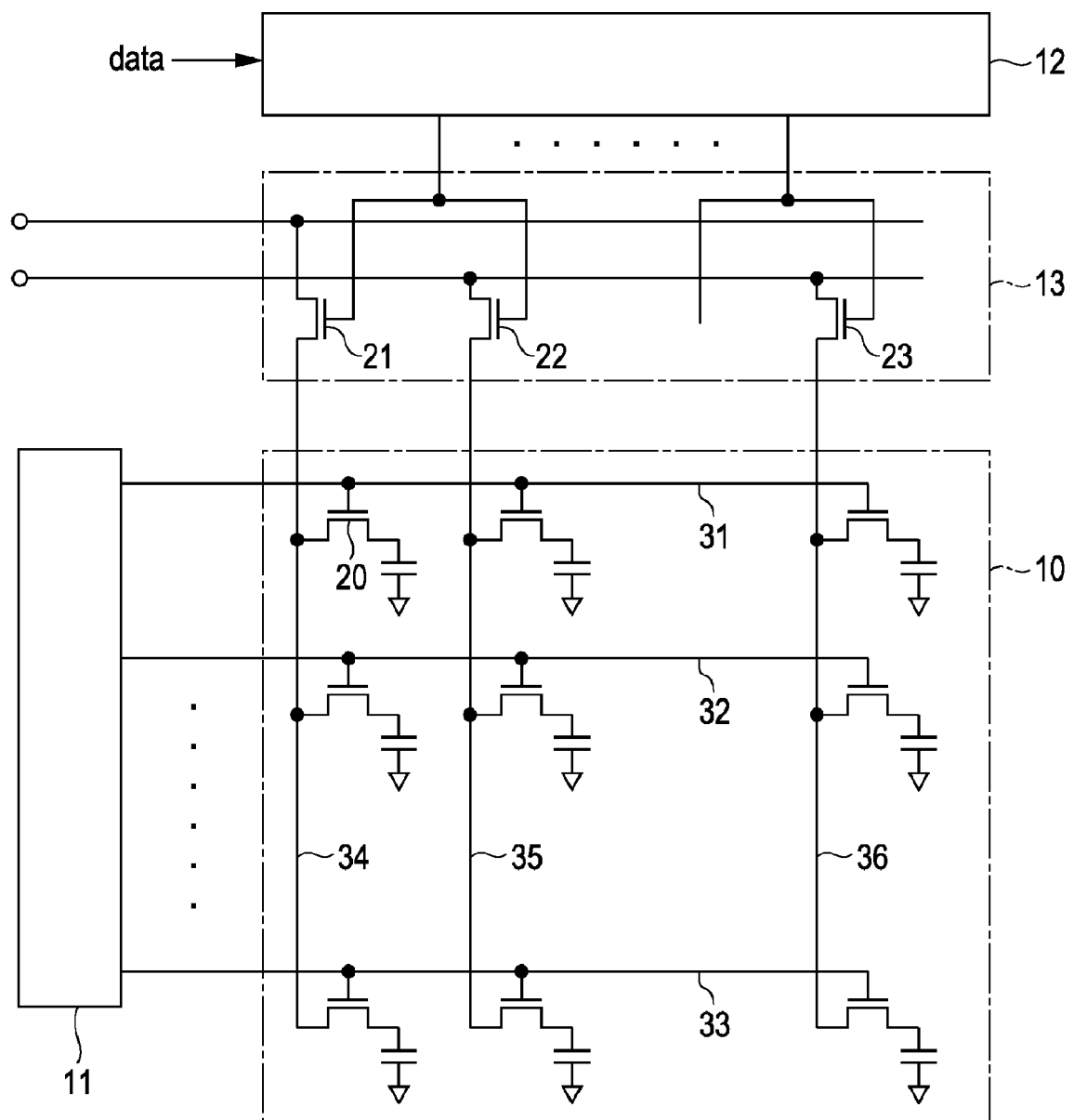
FIG. 5 is an equivalent circuit diagram of a liquid crystal apparatus, which is an electro-optical apparatus according to an embodiment of the invention.

A method for manufacturing a semiconductor apparatus according to an aspect of the invention can be applied to a method for manufacturing an electro-optical apparatus, such as a liquid crystal apparatus illustrated in FIG. 5. FIG. 5 is an equivalent circuit diagram of a liquid crystal apparatus, which is an electro-optical apparatus according to an embodiment of the invention.

A liquid crystal apparatus includes liquid crystal sealed in a device substrate and a counter substrate. As illustrated in FIG. 5, a liquid crystal apparatus includes a liquid crystal display 10 and peripheral circuitry in a peripheral region of the liquid crystal display 10. The peripheral circuitry includes a scanning circuit 11, which corresponds to a scanning line driving circuit disposed on the device substrate, a signal circuit 12, which corresponds to a signal line driving circuit, and a switching circuit 13. A matrix of switching elements 20 are disposed on the device substrate in the liquid crystal display 10. The switching elements 20, in combination with pixel electrodes, constitute a pixel circuit. The scanning circuit 11 sends scanning signals to liquid crystal display elements on the liquid crystal display 10 through scanning lines 31, 32, and 33. The signal circuit 12 transmits input data signals to the switching circuit 13. Switching elements 21, 22, and 23 of the switching circuit 13 distribute the data signals to the liquid crystal display elements through signal lines 34, 35, and 36.

The switching elements 20 constituting the pixel circuit are planar transistors that are formed on the device substrate by the manufacturing method according to the embodiment described above. The switching elements 21, 22, and 23 of the switching circuit 13 in the peripheral circuitry are fin-type transistors that are formed on the device substrate by the manufacturing method according to the embodiment described above. Alternatively, the switching elements 20 of the pixel circuit may be fin-type transistors, and the switching elements 21, 22, and 23 of the switching circuit 13 in the peripheral circuitry may be planar transistors.

Modifications

The invention is not limited to the embodiments described above and also includes modifications and improvements thereof without compromising the advantages of the invention. For example, the region of the step layer 103 or the number of step layers 103, or the regions or the number of the semiconductor thin films 104a corresponding to channels and disposed on the sidewalls 103b of the step layer 103 may be determined appropriately on the basis of the region of a fin-type transistor or the number of fin-type transistors to be formed. A fin-type transistor or a planar transistor manufactured in the embodiments described above may be appropriately used in a scanning line driving circuit, a signal line driving circuit, or a display of an electro-optical apparatus. For example, all of the transistors of a scanning line driving circuit and a signal line driving circuit may be fin-type transistors, and all of the transistors of a display may be planar transistors. Alternatively, all of the transistors of a scanning line driving circuit and a signal line driving circuit may be planar transistors, and all of the transistors of a display may be fin-type transistors. In addition to the liquid crystal apparatus, aspects of the invention may be applied to other electro-optical apparatuses, such as electroluminescence apparatuses and organic electroluminescence apparatuses.

What is claimed is:

1. A method for manufacturing a semiconductor apparatus, comprising:
    forming a step layer having a top surface and sidewalls in a first region on a substrate;
    forming a first semiconductor thin film on the top surface and sidewalls of the step layer;
    forming a second semiconductor thin film in a second region that is separated from the first region on the substrate;
    removing part of the first semiconductor thin film from the top surface while leaving part of the first semiconductor thin film on the sidewalls;
    removing part of the second semiconductor thin film in one part of the second region while leaving part of the second semiconductor thin film in the other part of the second region;
    removing the step layer;
    forming a fin-type transistor that includes the first semiconductor thin film disposed on the sidewalls as a channel; and
    forming a planar transistor that includes the part of the second semiconductor thin film remaining in the other part of the second region as a channel.

2. The method for manufacturing a semiconductor apparatus according to claim 1, further comprising forming an etching stopper layer on the substrate before forming a step layer.

3. A method for manufacturing an electro-optical apparatus that contains an electro-optic material between a pair of substrates and includes a transistor, the method comprising:
    forming a fin-type transistor on at least one of the substrates by the method for manufacturing a semiconductor apparatus according to claim 1.

4. A method for manufacturing an electro-optical apparatus that contains an electro-optic material between a pair of substrates and includes a pixel circuit and peripheral circuitry of a display on one of the substrates, the method comprising:
    forming a fin-type transistor on one of the pixel circuit and the peripheral circuitry, and forming a planar transistor on the other of the pixel circuit and the peripheral circuitry, on the one of the substrates, by the method for manufacturing a semiconductor apparatus according to claim 1.

* * * * *